US012713959B2

(12) United States Patent
Takahashi

(10) Patent No.: US 12,713,959 B2
(45) Date of Patent: Aug. 18, 2026

(54) SEMICONDUCTOR DEVICE AND METHOD FOR ADJUSTING PHASE CHARACTERISTICS THEREOF

(71) Applicant: KABUSHIKI KAISHA TOSHIBA, Tokyo (JP)

(72) Inventor: Koji Takahashi, Kawasaki Kanagawa (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 411 days.

(21) Appl. No.: 18/472,863

(22) Filed: Sep. 22, 2023

(65) Prior Publication Data

US 2024/0014150 A1 Jan. 11, 2024

Related U.S. Application Data

(63) Continuation of application No. PCT/JP2022/010311, filed on Mar. 9, 2022.

(30) Foreign Application Priority Data

Mar. 22, 2021 (JP) ................................ 2021-047036

(51) Int. Cl.
*H10W 72/50* (2026.01)
*H10W 44/20* (2026.01)
(Continued)

(52) U.S. Cl.
CPC ........... *H10W 72/50* (2026.01); *H10W 44/20* (2026.01); *H10W 44/206* (2026.01);
(Continued)

(58) Field of Classification Search
CPC ......... H01L 23/12; H01L 23/18; H01L 23/66; H01L 24/04; H01L 24/44; H01L 24/45;
(Continued)

(56) References Cited

U.S. PATENT DOCUMENTS 5,424,695 A 6/1995 Konishi
2010/0140721 A1 6/2010 Takagi
(Continued)

FOREIGN PATENT DOCUMENTS

DE 10123232 A1 * 11/2002 ........... H01L 25/071
JP S63-3440 A 1/1988
(Continued)

OTHER PUBLICATIONS

Translated Document of DE 10123232 A1, Inventor: Miller Gerhard, Published Date: Nov. 21, 2002 (Year: 2025).*
(Continued)

*Primary Examiner* — Cheung Lee
(74) *Attorney, Agent, or Firm* — Finnegan, Henderson, Farabow, Garrett & Dunner, LLP

(57) ABSTRACT

According to one embodiment, a semiconductor device includes a base, a first circuit board provided on the base, a second circuit board provided on the base at a certain interval from the first circuit board, a first connector provided with a first wire that is bridged between an upper surface of the first circuit board and an upper surface of the second circuit board to connect the two boards, and a first ferrite arranged on the base and directly below the first wire between the first circuit board and the second circuit board.

10 Claims, 9 Drawing Sheets

(51) Int. Cl.
*H10W 72/00* (2026.01)
*H10W 90/00* (2026.01)

(52) U.S. Cl.
CPC ........ *H10W 44/216* (2026.01); *H10W 44/234* (2026.01); *H10W 72/07552* (2026.01); *H10W 72/521* (2026.01); *H10W 72/5445* (2026.01); *H10W 90/754* (2026.01)

(58) Field of Classification Search
CPC ......... H01L 24/46; H01L 24/47; H01L 24/48; H01L 24/49; H01L 2223/6611; H01L 2223/6627; H01L 2223/6655; H01L 2224/4801; H01L 2224/48091; H01L 2224/48225; H01L 2224/49175; H01P 1/047; H10W 44/20; H10W 44/206; H10W 44/216; H10W 70/60; H10W 72/50; H10W 72/521; H10W 72/5445
See application file for complete search history.

(56) References Cited

U.S. PATENT DOCUMENTS

| | | | |
|---|---|---|---|
| 2016/0029477 | A1 | 1/2016 | Iwanami et al. |
| 2016/0343592 | A1 | 11/2016 | Costa et al. |
| 2020/0185359 | A1 | 6/2020 | Nakashima et al. |
| 2020/0411477 | A1 | 12/2020 | Liu et al. |

FOREIGN PATENT DOCUMENTS

| | | | |
|---|---|---|---|
| JP | H2-249215 | A | 10/1990 |
| JP | H6-314945 | A | 11/1994 |
| JP | H7-30052 | A | 1/1995 |
| JP | 2001-144506 | A | 5/2001 |
| JP | 2010-166287 | A | 7/2010 |
| JP | 2013-4947 | A | 1/2013 |
| JP | 5131481 | B2 | 1/2013 |
| JP | 2014-222836 | A | 11/2014 |
| JP | 2015-15496 | A | 1/2015 |
| JP | 2017-183629 | A | 10/2017 |
| WO | WO 2014/132610 | A1 | 9/2014 |
| WO | WO 2019/044748 | A1 | 3/2019 |

OTHER PUBLICATIONS

European Patent Office, Extended European Search Report in EP App. No. 22775118.7, 10 pages (Feb. 18, 2025).
Japan Patent Office, Office Action in JP App. No. 2021-047036, 3 pages, with machine translation, 3 pages (Oct. 29, 2024).

* cited by examiner

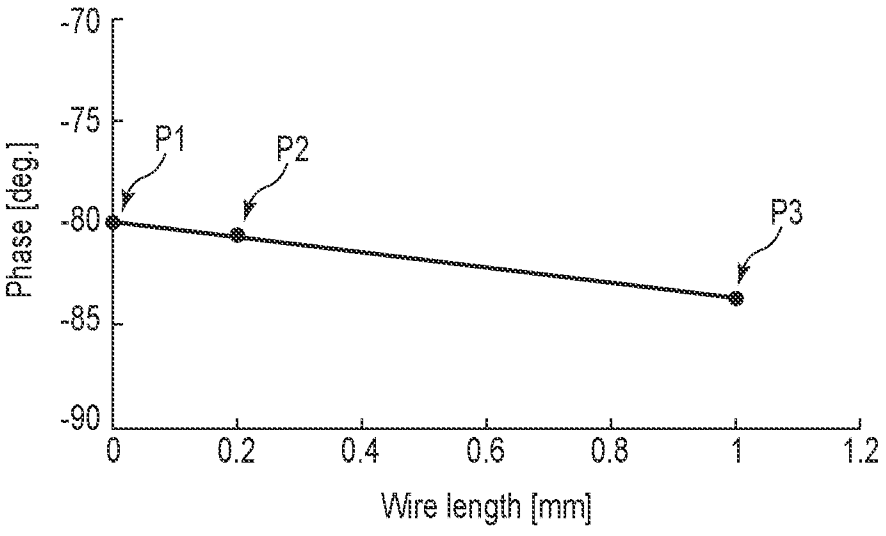
F I G. 8
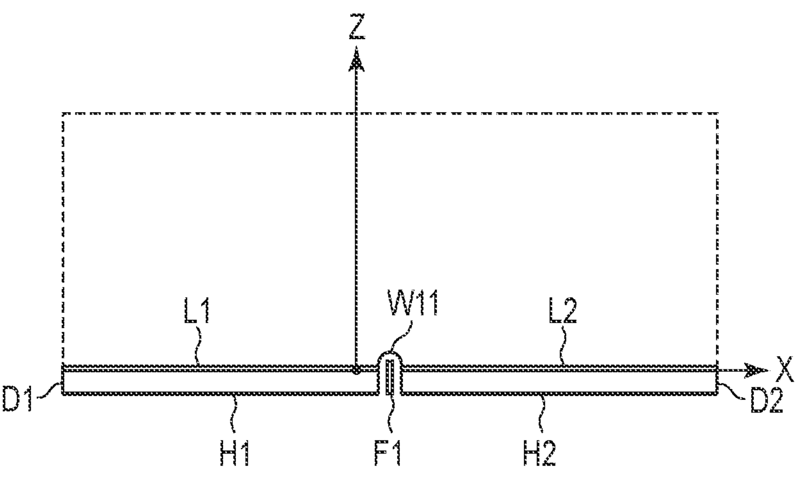
F I G. 9

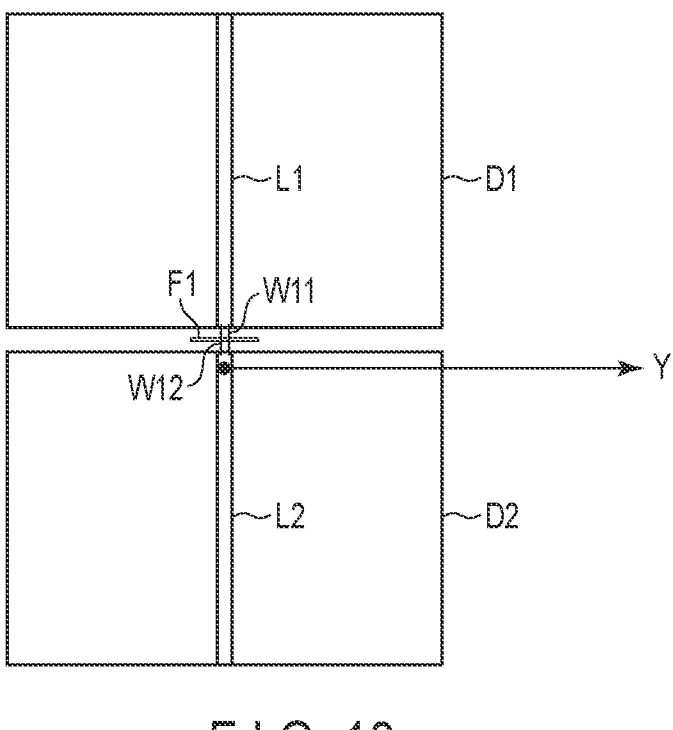
F I G. 10
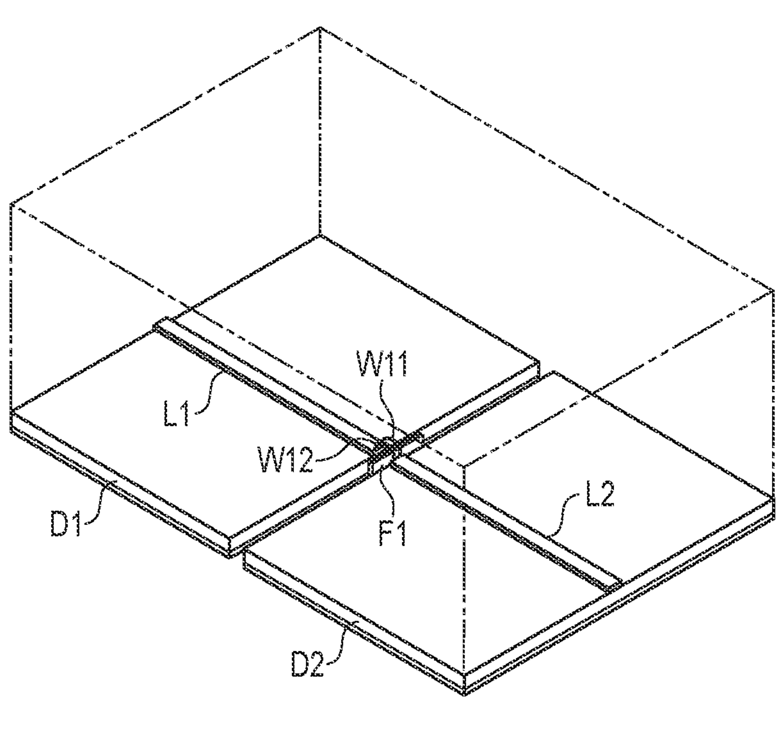
F I G. 11

SEMICONDUCTOR DEVICE AND METHOD FOR ADJUSTING PHASE CHARACTERISTICS THEREOF

CROSS-REFERENCE TO RELATED APPLICATIONS

This application is a Continuation Application of PCT Application No. PCT/JP2022/010311, filed Mar. 9, 2022 and based upon and claiming the benefit of priority from Japanese Patent Application No. 2021-047036, filed Mar. 22, 2021, the entire contents of all of which are incorporated herein by reference.

FIELD

Embodiments described herein relate generally to a semiconductor device and a method for adjusting phase characteristics thereof.

BACKGROUND

In a semiconductor device configuring a variable tuning filter, a coupled-line conductor is formed on a surface of a semiconductor substrate. The semiconductor substrate has a storage hole for storing a ferrite sphere at a position away from a center portion. A ferrite single-crystal sphere in a magnetostatic mode is stored in the storage hole.

By the way, a semiconductor device has a plurality of circuit boards therein, and each circuit board is connected by wires. In recent years, it has become desirable to mount many devices on circuit boards to realize various functions. For this reason, it has become necessary to increase the size of the internal circuit boards in semiconductor devices. On the other hand, when the size of the circuit board is increased, the distance between the circuit boards becomes narrower due to the limitation of the internal size of the semiconductor device, and, as a result, the length of the wires connecting the circuit boards also becomes shorter. If the wires become shorter, phase characteristics cannot be maintained, and the performance of the semiconductor device may deteriorate.

BRIEF DESCRIPTION OF THE DRAWINGS

FIG. 8 is a characteristic diagram showing an example of a phase shift that occurs in accordance with a wire length in the virtual model of the semiconductor device according to the same embodiment.

FIG. 9 is a cross-sectional view showing simulation conditions of case 3 in the virtual model of the semiconductor device according to the same embodiment.

FIG. 10 is a plan view showing the simulation conditions of case 3 in the virtual model of the semiconductor device according to the same embodiment.

FIG. 11 is a perspective view showing the simulation conditions of case 3 in the virtual model of the semiconductor device according to the same embodiment.

DETAILED DESCRIPTION

Figure 1:
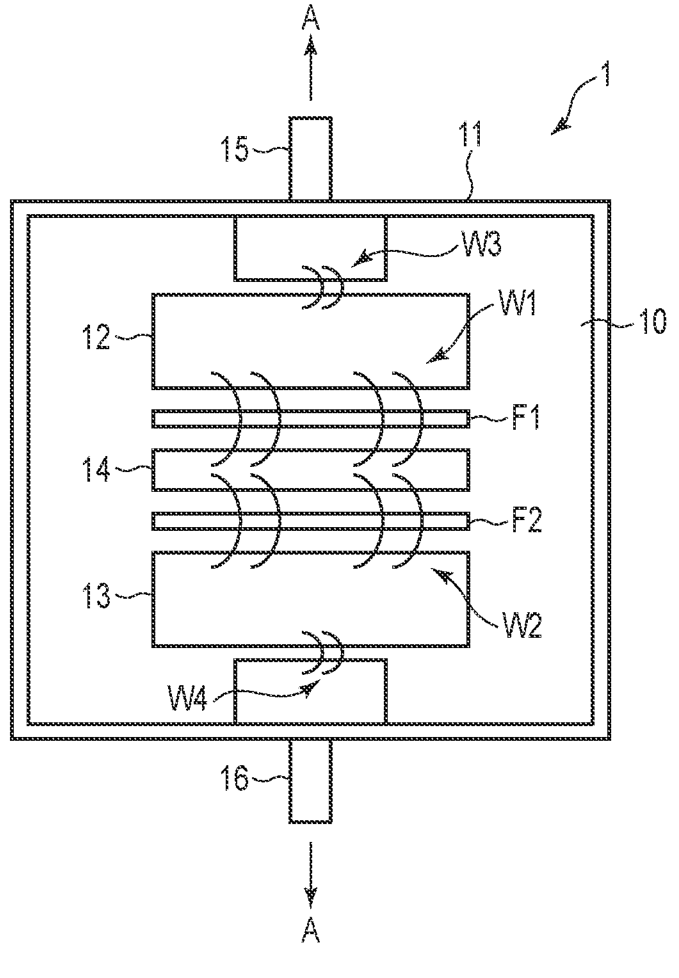
FIG. 1 is a plan view showing a configuration of a semiconductor device according to a first embodiment.

In general, according to one embodiment, a semiconductor device comprises a base, a first circuit board provided on the base, a second circuit board provided on the base at a certain interval from the first circuit board, a first connector provided with a first wire that is bridged between an upper surface of the first circuit board and an upper surface of the second circuit board to connect the two boards, and a first ferrite arranged on the base and directly below the first wire between the first circuit board and the second circuit board.

Also, according to one embodiment, a method for adjusting phase characteristics of a semiconductor device provides a first circuit board and a second circuit board at certain intervals on a base, bridges a first wire between an upper surface of the first circuit board and an upper surface of the second circuit board to connect the two boards, and arranges a first ferrite on the base and directly below the first wire between the first circuit board and the second circuit board to adjust phase characteristics of the first wire.

The following is a description of the embodiments with reference to the drawings. The disclosure is only an example, and the invention is not limited by the contents described in the following embodiments. Modifications readily conceivable by those skilled in the art are naturally included within the scope of the disclosure. For the sake of clarity of explanation, in some cases, the size, shape, etc., of each part in the drawings may be schematically represented by being changed with respect to the actual implementation. In some cases, the same reference numeral may be used for corresponding elements in multiple drawings, and detailed explanations may be omitted.

First Embodiment

Figure 2:
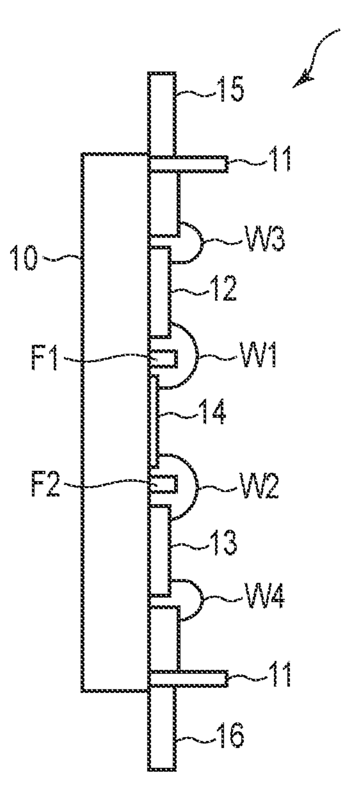
FIG. 2 is a cross-sectional view showing a cross-section of the semiconductor device shown in FIG. 1 along line A-A.

FIG. 1 is a plan view showing a schematic configuration of a semiconductor device according to a first embodiment, and FIG. 2 is a cross-sectional view showing a cross-section of the semiconductor device shown in FIG. 1 along line A-A.

As shown in FIG. 1, a semiconductor device 1 comprises a base 10, one side of which is a mounting surface for electronic components and the other side of which is a heat dissipation surface. The upper surface of the base 10, i.e., the mounting surface for electronic components, is provided with a cover 11 formed into a box shape, for example, by a shielding material, so as to cover the entire surface.

On the base 10, a first circuit board 12 and a second circuit board 13 of the same shape as the first circuit board 12 are placed at predetermined intervals. The first circuit board 12 and the second circuit board 13 are, for example, matching circuits that contain alumina (aluminum oxide: Al2O3) as a material and have a predetermined dielectric constant. Between the first circuit board 12 and the second circuit board 13 is disposed an FET board 14 on which a field effect transistor (FFT) power amplification circuit is formed. The FET board 14 has a rectangular shape and is arranged in parallel between the first circuit board 12 and the second circuit board 13. On both sides of the base 10 in the vertical direction in the drawing, a lead electrode part (first electrode part) 15 and a lead electrode part (second electrode part) 16 are provided so as to penetrate a part of a wall surface (top side and bottom side in FIG. 1) of the cover 11 that is in contact with the base 10.

One or more first wires configuring a first connector W1 are bridged between the upper surface of the first circuit board 12 and the upper surface of the FET board 14, and the boards are electrically connected by the first wires. One or more second wires configuring a second connector W2 are also bridged between the upper surface of the FET board 14 and the upper surface of the second circuit board 13, and the boards are electrically connected by the second wires. Both wires used for the first connector W1 and the second connector W2 are formed into an arch shape that, in the connected state, draws a semicircle on the upper side with respect to the base 10. Note that, in FIG. 1, a case in which the connectors W1 and W2 are each configured by four wires (two pairs of two wires) is shown; however, the number of wires in the connectors W1 and W2 is not limited to this and can be determined arbitrarily, as long as there is at least one wire.

One or more third wires configuring a third connector W3 are bridged between the upper surface of the first circuit board 12 and the upper surface of the lead electrode part (first electrode part) 15, and the boards are electrically connected by the third wires. One or more fourth wires configuring a fourth connector W4 are bridged between the upper surface of the second circuit board 13 and the upper surface of the lead electrode part (second electrode part) 16, and the boards are electrically connected by the fourth wires.

The surfaces of the first circuit board 12, the second circuit board 13, and the FET board 14 are provided with electronic circuits by means of microstrip lines (not shown). In the semiconductor device 1 in which the microstrip lines are formed in this manner, a current input from the lead electrode part 15 is configured to pass through the third wire of the third connector W3, the microstrip line of the first circuit board 12, the first wire of the first connector W1, the microstrip line of the FET board 14, the second wire of the second connector W2, the microstrip line of the second circuit board 13, the fourth wire of the fourth connector W4, and the lead electrode part 16.

In the present embodiment, between the first circuit board 12 and the FET board 14, a ferrite (first ferrite) F1 is arranged on the base 10 and directly below the arched first wire of the first connector W1, and, between the second circuit board 13 and the FET board 14, a ferrite (second ferrite) F2 is arranged on the base 10 and directly below the arched second wire of the second connector W2. The ferrites F1 and F2 are rod-shaped members (rectangular shape) with a rectangular cross-section. In the present embodiment, a case in which the length of the ferrites F1 and F2 is approximately the same as the length of the first circuit board 12, the second circuit board 13, and the FET board 14 in the longitudinal direction is explained.

One surface of the ferrites F1 and F2 (a surface with a shorter cross-sectional length, as shown in FIG. 2) is bonded respectively on the base 10 using solder, for example, to fix the ferrites F1 and F2 to the base 10. Here, the ferrites F1 and F2 are magnetic materials (electronic materials) made by mixing and sintering cobalt, nickel, manganese, etc., with iron oxide as the main component, and are manufactured by baking and hardening powdered materials at a high temperature of 1,000 to 1,400° C. There are many types depending on the composition and blending of materials, but rectangular shaped ferrites F1 and F2 can be produced relatively easily because they are made by pressing and solidifying powders.

As already mentioned, the semiconductor device 1 in the present embodiment has the ferrites F1 and F2 arranged therein. Therefore, in a case where a current is applied to the semiconductor device 1, it is assumed that current characteristics are affected by a magnetic force generated by the ferrites F1 and F2. The following explains simulation results of three cases, such as a case in which ferrites are not arranged in a virtual model of the semiconductor device 1 (hereinafter referred to as case 1), the length of a wire is adjusted without arranging the ferrites in the virtual model of the semiconductor device 1 (hereinafter referred to as case 2), and a case in which ferrites are arranged in the virtual model of the semiconductor device 1 (hereafter referred to as case 3). The simulations conducted here examine the effect of ferrite arrangement in a case where two circuit boards are connected by a wire (one transmission line).

Figure 3:
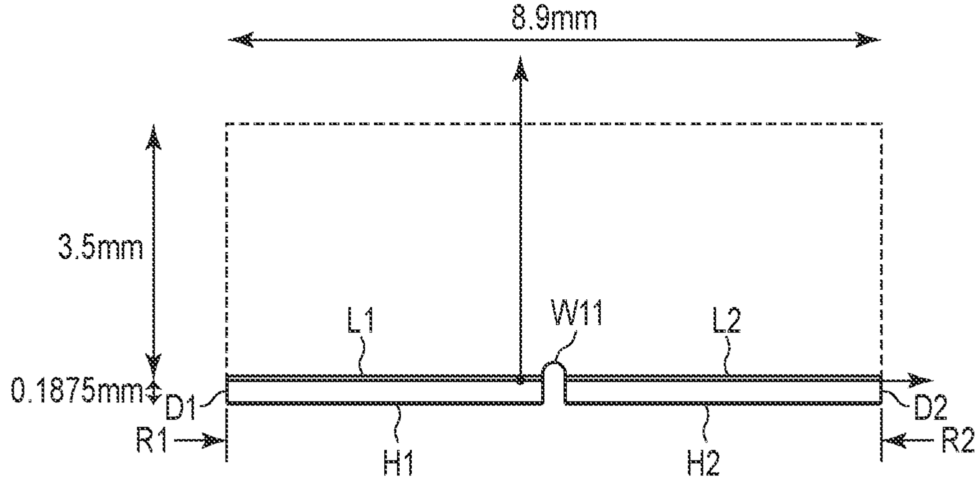
FIG. 3 is a cross-sectional view showing simulation conditions of case 1 in cross-section in a virtual model of the semiconductor device according to the same embodiment.
Figure 4:
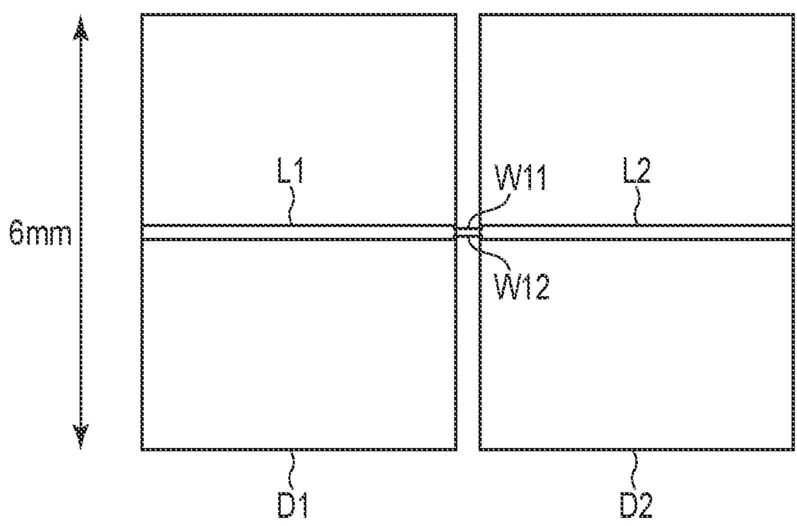
FIG. 4 is a plan view showing the simulation conditions of case 1 in a plan state in the virtual model of the semiconductor device according to the same embodiment.
Figure 5:
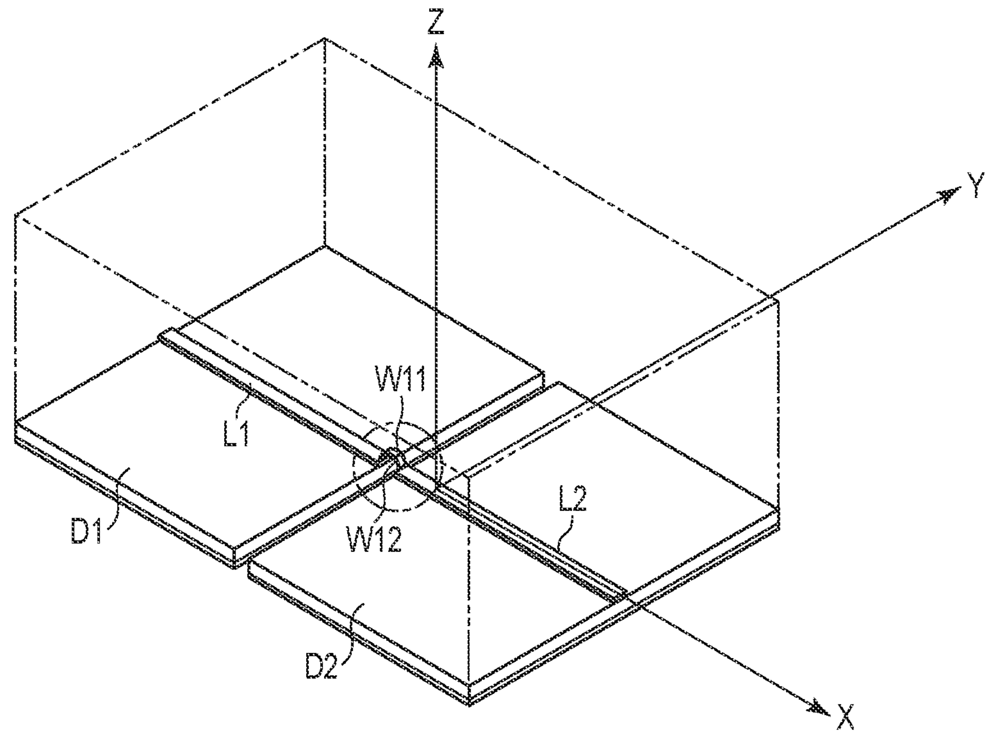
FIG. 5 is a perspective view showing the simulation conditions of case 1 in perspective in the virtual model of the semiconductor device according to the same embodiment.

First, with reference to FIG. 3 to FIG. 5, the virtual model of the semiconductor device 1 is explained for case 1. FIG. 3 to FIG. 5 illustrate simulation conditions of case 1, FIG. 3 is a cross-sectional view showing the simulation conditions in cross-section, FIG. 4 is a plan view showing the simulation conditions in a plan state, and FIG. 5 is a perspective view showing the simulation conditions in perspective. Here, in FIG. 3 to FIGS. 5, D1 and D2 are dielectric substrates that are rectangular and of the same dimensions and thickness as each other, and are arranged at certain intervals on the same plane; L1 and L2 are microstrip lines formed on the upper surface of the dielectric substrates D1 and D2, respectively, in the same straight line; H1 and H2 are metal plates formed on the entire lower surface of the dielectric substrates D1 and D2, respectively, to serve as a grounding layer; and W11 and W12 are a pair of wires connecting the ends of the microstrip lines L1 and L2, respectively. The upper side of the dielectric substrates D1 and D2 shall be a space formed by an air layer as a radiation boundary.

As shown in FIG. 3, the length of microstrip lines L1 and L2, which are wired to the upper surfaces of two dielectric substrates D1 and D2, respectively (length of the short side of the dielectric substrates D1 and D2), and the length consisting of the substrate interval of the dielectric substrates D1 and D2 (connection length of the wire W11 (W12)) are 8.9 mm; the height of the space from the upper surface of the dielectric substrates D1 and D2 is 3.5 mm; and the thickness of the dielectric substrates D1 and D2 is mm. Furthermore, as shown in FIG. 4, the vertical width (length of a long side) of the two dielectric substrates D1 and D2 is 6.0 mm, and the simulation is performed under a condition that a resistance of 50Ω is applied to reference surfaces R1 and R2 on the side surfaces of the dielectric substrates D1 and D2.

Figure 6:
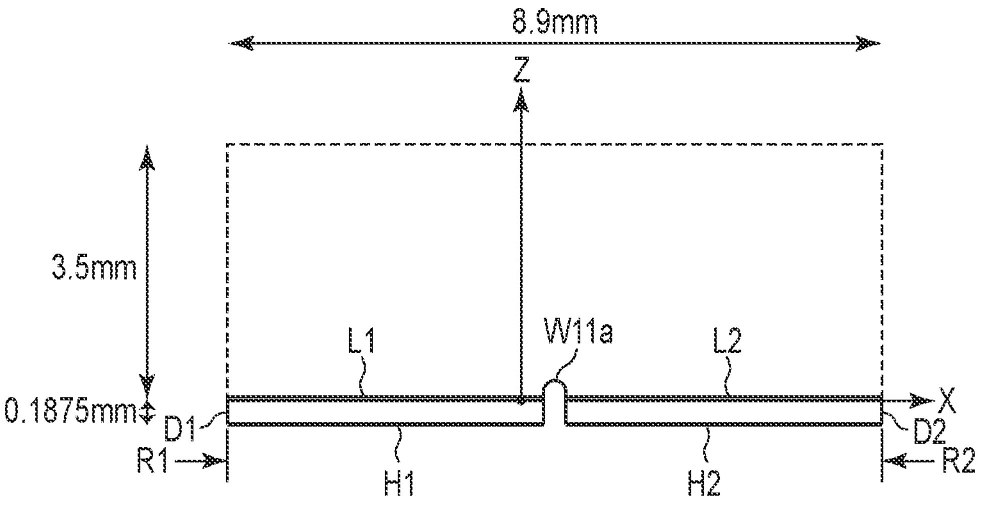
FIG. 6 is a cross-sectional view showing simulation conditions of case 2 in the virtual model of the semiconductor device according to the same embodiment.
Figure 7:
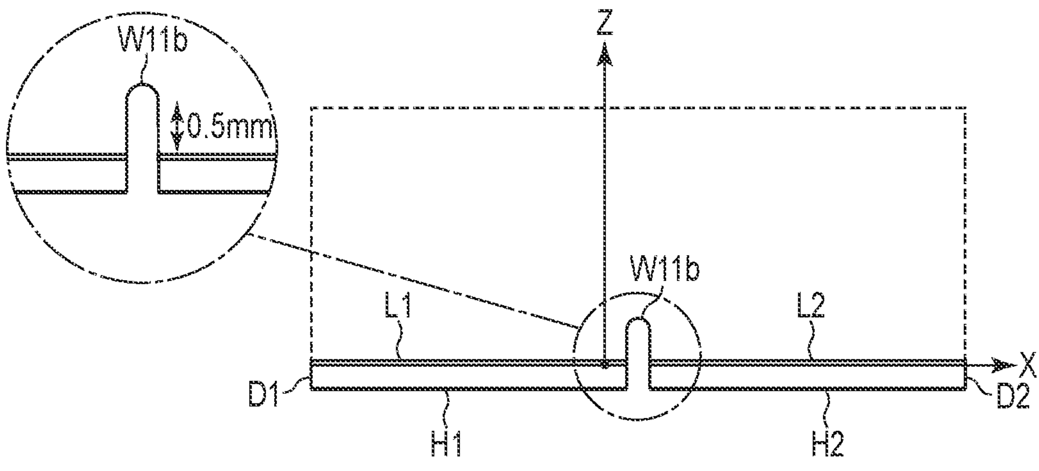
FIG. 7 is a cross-sectional view showing the simulation conditions of case 2 in the virtual model of the semiconductor device according to the same embodiment.

Next, with reference to FIG. 6 to FIG. 8, the virtual model of the semiconductor device 1 is explained for case 2. FIG. 6 to FIG. 8 illustrate simulation conditions of case 2, FIG. 6 is a cross-sectional view showing the simulation conditions in cross-section, FIG. 5 is a plan view showing the simulation conditions in a plan state, and FIG. 8 is a characteristic diagram showing an example of a phase shift that occurs according to a wire length.

The simulation conditions of case 2 are identical to those of case 1, except that the wire length (electrical length) is different. FIG. 6 shows a case of a simulation with wires W11*a* and W12*a* (not shown) having an electrical length 0.2 mm longer than the wires W11 and W12 of case 1, and FIG. 7 shows a case of a simulation with wires W11*b* and W12*b* (not shown) having an electrical length 1.0 mm longer than the wires W11 and W12 of case 1. Note that, as shown in FIG. 6 and FIG. 7, the wires W11*a* and W12*a* and W11*b* and W12*b* extend in length in the form of a vertical extension from the connection end with the microstrip lines L1 and L2. Thus, case 2 describes a case where the electrical length of the wires is lengthened from case 1. If the electrical length of the wire can be lengthened, a physical length of the wire can be shortened.

FIG. 8 is a characteristic diagram showing an example of a shift in phase characteristics caused in accordance with the length of the wire. In FIG. 8, a horizontal axis is the length of the wire ([mm]) and a vertical axis shows the phase (Phase [deg.]). Point P1 is a case for the condition of FIG. 3 (case 1) because the wire length is 0, Point P2 is a case for the condition of FIG. 6 (case 2) because the wire length is mm, and point P3 is a case for the condition of FIG. 7 (case 2) because the wire length is 1.0 mm. FIG. 8 shows that the phase is delayed as the wire length is lengthened. For example, at point P3 where the wire length is extended by 1.0 mm from the state shown in FIG. 3, the phase is shown to be delayed by approximately 4 deg.

Next, case 3 is explained. FIG. 9 to FIG. 11 illustrate conditions for the simulation of case 3. The simulation of case 3 is identical to that of case 1, except that the ferrite F1 is arranged directly below the arches of the wires W11 and W12. The ferrite F1 is a rectangular body of 0.05×1.0×0.4 (mm) in the present simulation. Also, the material constant (relative magnetic permeability) of the ferrite F1 is 640 of Ni—Zn system.

Figure 12:
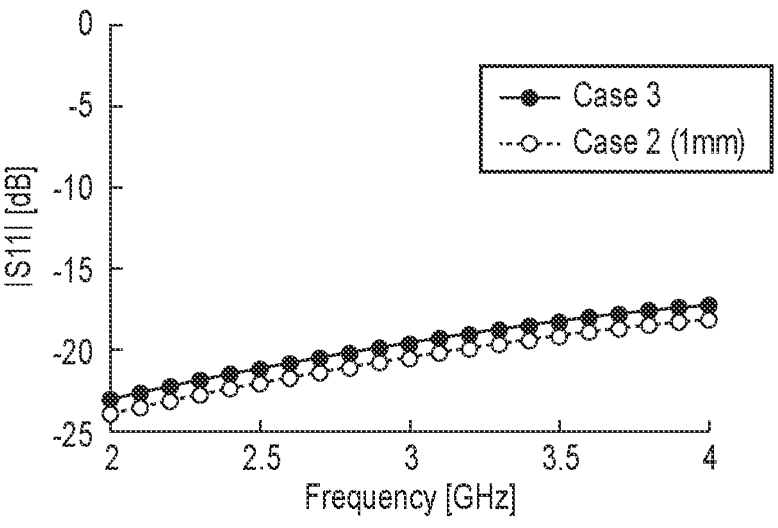
FIG. 12 is a characteristic diagram showing an example of simulation results of an S11 characteristic in the virtual model of the semiconductor device according to the same embodiment.
Figure 13:
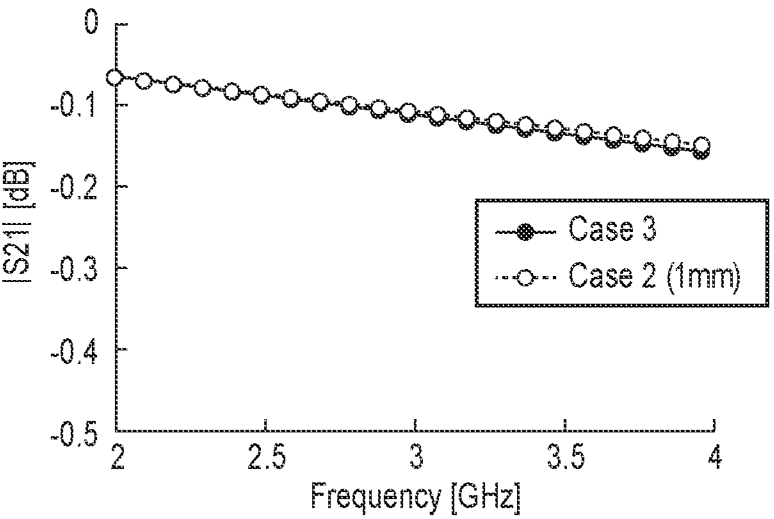
FIG. 13 is a characteristic diagram showing an example of simulation results of an S21 characteristic in the virtual model of the semiconductor device according to the same embodiment.
Figure 14:
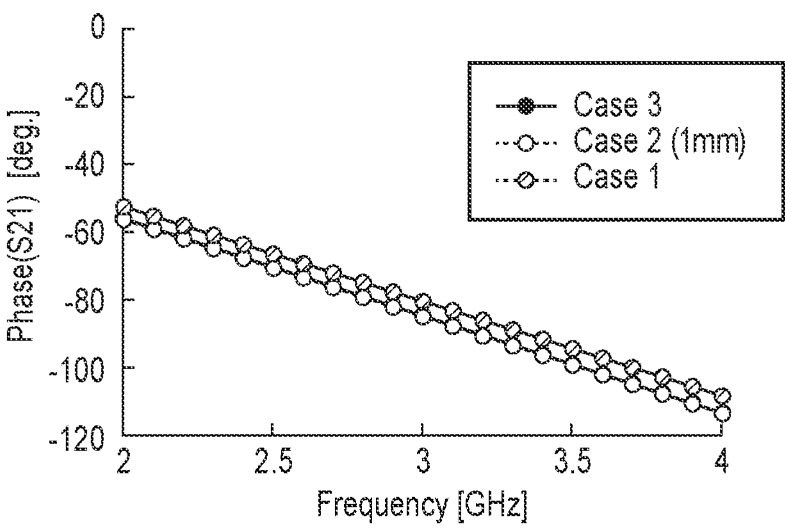
FIG. 14 is a characteristic diagram showing an example of simulation results of phase characteristics in the virtual model of the semiconductor device according to the same embodiment.

Next, simulation results are explained. FIG. 12 to FIG. 14 show results of S11 and S21 characteristics of an S parameter, comparing the simulation results for the case of case 1, the case of case 2 (wire length 1.0 mm), and the case of case 3. FIG. 12 shows an example of the simulation results of an S11 characteristic, FIG. 13 shows an example of the simulation results of an S21 characteristic, and FIG. 14 shows an example of the simulation results of the phase characteristics. Here, the S11 characteristic is, for example, a characteristic showing the amount of power input to port 1 (microstrip line L1) returning to port 1, and the S21 characteristic is, for example, a characteristic showing the amount of power input to port 1 that is reflected to port 2 (microstrip line L2).

It can be seen that the S11 characteristic shown in FIG. 12 and the S21 characteristic shown in FIG. 13 are generally equal. The phase characteristics shown in FIG. 14 also show that the phase is delayed in case 3 compared to case 1. From this simulation result, it can be seen that the arrangement of the ferrite F1 does not change the S11 characteristic and the S21 characteristic, and the same phase delay can be obtained as in the case of lengthening the electric length.

Therefore, from the above simulation results, by arranging the ferrite F1 on the base 10 and directly below the first wire that configures the first connector W1 in the semiconductor device 1, the phase of the current from the first circuit board 12 to the FET board 14 can be adjusted, and the same effect as lengthening the electrical length can be obtained. Also, by arranging the ferrite F2 on the base 10 and directly below the second wire that configures the second connector W2, the phase of the current from the FET board 14 to the second circuit board 14 can be adjusted, and the same effect as lengthening the electrical length can be obtained. Since the same effect as lengthening the electrical length can be obtained, the semiconductor device 1 can shorten the length of each wire of the first connector W1 and the second connector W2 without affecting the phase characteristics.

Also, because the semiconductor device 1 can shorten the length of each wire of the first connector W1 and the second connector W2 as already described, the size of the first circuit board 12, the second board circuit 13, and the FET board 14 can be increased inside the semiconductor device 1. Therefore, it is possible to increase the number of functions to be mounted on the first circuit board 12, the second circuit board 13, and the FET board 14.

Second Embodiment

Figure 15:
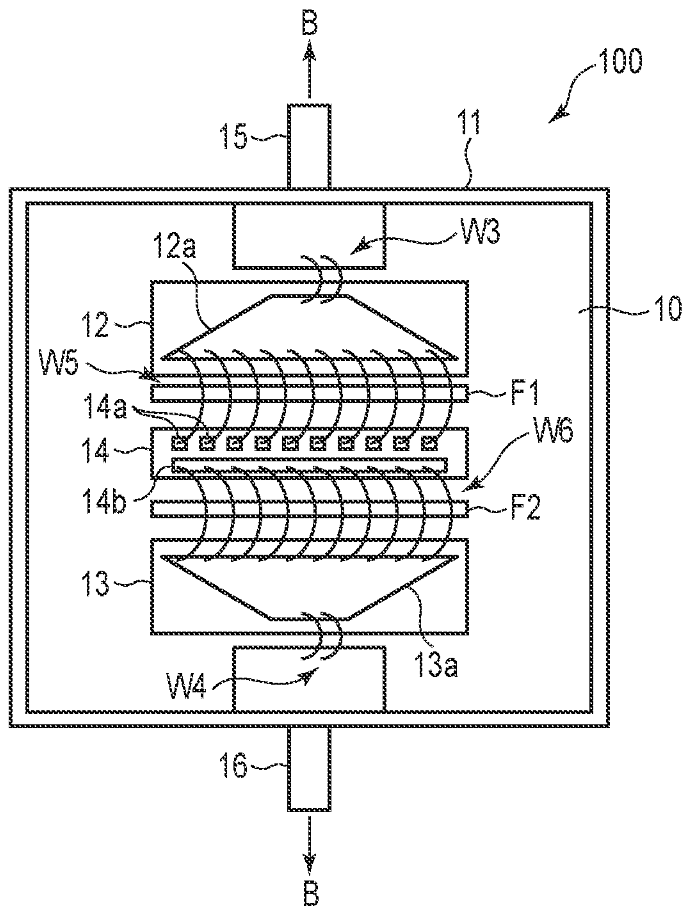
FIG. 15 is a plan view showing a configuration of a semiconductor device in the semiconductor device according to a second embodiment.
Figure 16:
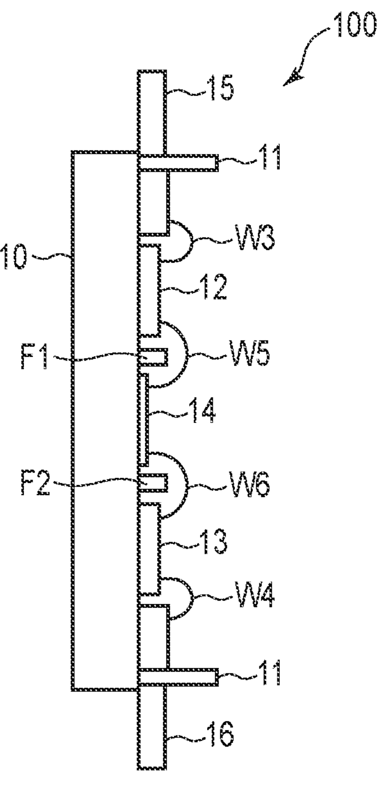
FIG. 16 is a cross-sectional view showing a cross-section of the semiconductor device shown in FIG. 15 along line B-B.

FIG. 15 shows an example of a configuration of a semiconductor device 100 of a second embodiment, and FIG. 16 is a cross-sectional view showing a cross-section along line B-B in FIG. 15. Compared to the semiconductor device 1 of the first embodiment, the configuration of an FET board 14 is more detailed. Note that the same configurations as those of the semiconductor device 1 described above are denoted by the same symbols, and detailed description thereof is omitted. In addition, illustration of the microstrip lines is omitted.

As shown in FIG. 15 and FIG. 16, an electrode 12*a* is provided on a first circuit board 12, and an electrode 13*a* is provided on a second circuit board 13. In addition, the FET board 14 has a plurality of electrodes 14*a* provided on the first circuit board 12 side and an electrode 14*b* provided on the second circuit board 13 side. The plurality of electrodes 14*a* are lined up in one example in the longitudinal direction of the FET board 14 at equal intervals. The electrode 14*b* has a rectangular shape and is arranged parallel to the longitudinal direction of the FET board 14.

The electrode 12*a* of the first circuit board 12 is configured to spread from a lead electrode part side in a fan shape so as to correspond to the width of the plurality of electrodes 14*a* of the FET board 14. A plurality of fifth wires configuring a fifth connector W5 connect each of the plurality of electrodes 14*a* to the electrode 12*a*. In addition, the electrode 13*a* of the second circuit board 13 is configured to spread from a lead electrode part 16 side in a fan shape so as to correspond to the width of the electrode 14*b* of the FET board 14. A plurality of sixth wires configuring a sixth connector W6 connect the electrode 14*b* to the electrode 13*a*.

Furthermore, a ferrite F1 is arranged between the first circuit board 12 and the FET board 14, on the base 10 and directly below the arched fifth wires of the fifth connector W5. The ferrite F1 is rectangular in shape, and both ends of the ferrite F1 in the longitudinal direction are configured to exceed the width of the plurality of fifth wires of the fifth connector W5 in the alignment direction. Similarly, a ferrite F2 is arranged between the second circuit board 13 and the FET board 14, on the base 10 and directly below the arched sixth wires of the sixth connector W6. In the same manner as the ferrite F1, the ferrite F2 is rectangular in shape, and both ends of the ferrite F2 in the longitudinal direction are configured to exceed the width of the sixth connector W6 in the alignment direction.

Also in the semiconductor device 100 configured as described above, the same effects as those of the first embodiment can be achieved. More specifically, in the semiconductor device 100, by arranging the ferrite F1 on the base 10 and directly below the arched fifth wires of the fifth connector W5, the phase of the current from the first circuit board 12 to the FET board 14 can be adjusted, and the same effect as lengthening the electrical length can be obtained. In addition, by arranging the ferrite F2 on the base 10 and directly below the arched sixth wire of the sixth connector W6, the phase of the current from the FET board 14 to the second circuit board 14 can be adjusted, and the same effect as lengthening the electrical length can be obtained. Thus, since the same effect as lengthening the electrical length can be obtained, the semiconductor device 100 can shorten the length of each wire of the fifth connector W5 and the sixth connector W6 without affecting the phase characteristics.

Because the semiconductor device 100 can shorten the length of each wire of the fifth connector W5 and the sixth connector W6 as already described, the size of the first circuit board 12, the second board circuit 13, and the FET board 14 can be increased inside the semiconductor device 100. Therefore, in the same manner as in the first embodiment, it becomes possible to increase the number of functions to be mounted on the first circuit board 12, the second circuit board 13, and the FET board 14.

Furthermore, in the first and second embodiments above, the ferrite F1 (or the ferrite F2) was arranged directly below the arched wires of the first connector W1 and the fifth connector W5 (or the second connector W2, the sixth connector W6) connecting the first circuit board 12 (or the second circuit board 13) and the FET board 14; however, the same effect can be achieved even in a case where the first circuit board 12 (or the second circuit board 13) is not connected to the FET board 14, if the ferrite is arranged directly below the wires connecting the circuit board to the circuit board. In addition, the above techniques can be applied as long as there are at least two circuit boards inside the semiconductor device 100, and it is a semiconductor device in which the two circuit boards are connected by wires.

Furthermore, in each of the above embodiments, a case where the shape of the cross-sections of the ferrites F1 and F2 is rectangular is described; however, it is not limited thereto. For example, the shape of the cross-sections of the two ferrites may be circular, and the ferrites F1 and F2 with such a shape of cross-sections may be arranged on the base 10 and directly below the arched wires of the first connector W1 and the fifth connector W5 (or the second connector W2, the sixth connector W6) inside the semiconductor packages 1 and 100.

Furthermore, the techniques of the above embodiments can be used not only in the case of increasing the size of the first circuit board 12, the second circuit board 13, and the FET board 14 inside the semiconductor devices 1 and 100, but also in the case of increasing the number of stages of circuit boards inside the semiconductor devices 1 and 100 since the distance between the circuit boards can be made smaller. In other words, according to the technique of the present embodiment, the degree of freedom in designing the interior of the semiconductor devices 1 and 100 can be improved. In addition, if the circuit board is used as a matching circuit and the number of stages of the matching circuit is increased inside the semiconductor device, the semiconductor devices 1 and 100 can achieve, for example, widening the S-band. Furthermore, the semiconductor devices 1 and 100 of each of the above embodiments are described as having a first circuit board 12, a second circuit board 13, and a FET board 14, having first connector W1 wires and second connector W2 wires, or fifth connector W5 wires and sixth connector W6 wires to connect them, and having ferrites F1 and F2; however, it is not limited thereto. In a case where the semiconductor has four or more circuit boards, the ferrites may be arranged on the base and directly below the arched wires that connect each circuit board, respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
- a base;
- a first circuit board provided on the base;
- a second circuit board provided on the base at a certain interval from the first circuit board;
- a first connector provided with a first wire that is bridged between an upper surface of the first circuit board and an upper surface of the second circuit board to connect the two boards; and
- a first ferrite arranged on the base and directly below the first wire between the first circuit board and the second circuit board, wherein
- the first connector is provided with a plurality of the first wires that are bridged in parallel at a plurality of locations between the upper surface of the first circuit board and the upper surface of the second circuit board to connect the two boards, and
- the first ferrite is a rectangular body with both side surfaces in a longitudinal direction facing side surfaces of the first circuit board and the second circuit board, respectively, and with both ends in the longitudinal direction having a length exceeding a width of an alignment direction of the plurality of first wires, and is arranged directly below all of the plurality of first wires.

2. The semiconductor device of claim 1, wherein
- the first circuit board is a matching circuit that adjusts a phase of a voltage, and
- the second circuit board is a field effect transistor power amplifier circuit.

3. The semiconductor device of claim 1, wherein the first wire is formed in an upwardly arched shape with respect to the base.

4. The semiconductor device of claim 1, further comprising:
- a third circuit board provided on the base at a certain interval from the second circuit board;

a second connector provided with a second wire that is bridged between an upper surface of the third circuit board and an upper surface of the second circuit board to connect the two boards; and a second ferrite arranged on the base and directly below the second wire between the third circuit board and the second circuit board.

5. The semiconductor device of claim 4, wherein the second connector is provided with a plurality of the second wires that are bridged in parallel at a plurality of locations between the third circuit board and the second circuit board to connect the two boards, and the second ferrite is a rectangular body with both sides in a longitudinal direction facing side surfaces of the third circuit board and the second circuit board, respectively, and with both ends in the longitudinal direction having a length exceeding a width of an alignment direction of the plurality of second wires, and is arranged directly below all of the plurality of second wires.

6. The semiconductor device of claim 4, wherein the second wire is formed in an upwardly arched shape with respect to the base.

7. A method for adjusting phase characteristics of a semiconductor device, comprising:

providing a first circuit board and a second circuit board at certain intervals on a base;

bridging a first wire between an upper surface of the first circuit board and an upper surface of the second circuit board to connect the two boards; and arranging a first ferrite on the base and directly below the first wire between the first circuit board and the second circuit board to adjust phase characteristics of the first wire.

8. The method for adjusting phase characteristics of the semiconductor device of claim 7, wherein the first wire is formed in an upwardly arched shape with respect to the base.

9. The method for adjusting phase characteristics of the semiconductor device of claim 7, comprising:

providing a third circuit board on the base at a certain interval from the second circuit board; bridging a second wire between an upper surface of the third circuit board and an upper surface of the second circuit board to connect the two boards; and arranging a second ferrite on the base and directly below the second wire between the third circuit board and the second circuit board to adjust phase characteristics of the second wire.

10. The method for adjusting phase characteristics of the semiconductor device of claim 9, wherein the second wire is formed in an upwardly arched shape with respect to the base.

* * * * *